(12) United States Patent
Ariumi (10) Patent No.: US 10,361,663 B2
(45) Date of Patent: Jul. 23, 2019

(54) LOW-NOISE AMPLIFIER AND ELECTRONIC DEVICE

(71) Applicant: Murata Manufacturing Co., Ltd., Kyoto (JP)

(72) Inventor: Saneaki Ariumi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/836,115

(22) Filed: Dec. 8, 2017

(65) Prior Publication Data

US 2018/0102745 A1  Apr. 12, 2018

Related U.S. Application Data

(63) Continuation of application No. PCT/JP2016/059650, filed on Mar. 25, 2016.

(30) Foreign Application Priority Data

Jun. 11, 2015 (JP) .................. 2015-118292

(51) Int. Cl.
  *H03F 3/191* (2006.01)
  *H03F 1/26* (2006.01)
  (Continued)

(52) U.S. Cl.
  CPC ............. *H03F 1/26* (2013.01); *H03F 3/19* (2013.01); *H03F 3/193* (2013.01); *H03F 3/21* (2013.01); *H03F 3/245* (2013.01); *H03F 3/601* (2013.01); *H03F 2200/213* (2013.01); *H03F 2200/294* (2013.01); *H03F 2200/378* (2013.01); *H03F 2200/451* (2013.01); *H03F 2203/45576* (2013.01)

(58) Field of Classification Search
  CPC .......... H03F 3/191; H03F 3/193; H03F 3/195
  USPC ...................................... 330/302, 305, 306
  See application file for complete search history.

(56) References Cited

U.S. PATENT DOCUMENTS 6,426,780 B1   7/2002  LeRoy
6,973,670 B1  12/2005  Yoshida et al.
(Continued)

FOREIGN PATENT DOCUMENTS

JP   11234063 A    8/1999
JP  2001-136408 A  5/2001
(Continued)

OTHER PUBLICATIONS

International Search Report for International Application No. PCT/JP2016/059650 dated Jun. 7, 2016.
(Continued)

*Primary Examiner* — Steven J Mottola
(74) *Attorney, Agent, or Firm* — Pearne & Gordon LLP (57) ABSTRACT

Provided is a low-noise amplifier that can effectively suppress noise included in an input signal. A low-noise amplifier according to an embodiment of the present invention amplifies a reception signal in a predetermined frequency band from an antenna. The low-noise amplifier includes an input terminal, an output terminal, a field effect transistor, and a branch circuit. The branch circuit is branched from a circuit connecting the input terminal or the output terminal to the field effect transistor. The branch circuit is connected to the elastic wave resonator.

16 Claims, 10 Drawing Sheets

(51) Int. Cl.
    *H03F 3/19*     (2006.01)
    *H03F 3/21*     (2006.01)
    *H03F 3/193*     (2006.01)
    *H03F 3/24*     (2006.01)
    *H03F 3/60*     (2006.01)

(56) References Cited

U.S. PATENT DOCUMENTS

| | | |
|---|---|---|
| 9,431,996 B2 | 8/2016 | Watanabe et al. |
| 2012/0293268 A1* | 11/2012 | Laurila ............... H03F 1/347 |
| | | 330/302 |

FOREIGN PATENT DOCUMENTS

| | | |
|---|---|---|
| JP | 2012134637 A | 7/2012 |
| JP | 2015-27018 A | 2/2015 |
| JP | 2015-73331 A | 4/2015 |

OTHER PUBLICATIONS

Written Opinion for International Application No. PCT/JP2016/059650 dated Jun. 7, 2016.

* cited by examiner

LOW-NOISE AMPLIFIER AND ELECTRONIC DEVICE

This is a continuation of International Application No. PCT/JP2016/059650 filed on Mar. 25, 2016 which claims priority from Japanese Patent Application No. 2015-118292 filed on Jun. 11, 2015. The contents of these applications are incorporated herein by reference in their entireties.

BACKGROUND

Technical Field

The present disclosure relates to a low-noise amplifier and an electronic device including the low-noise amplifier.

A low-noise amplifier amplifies a reception signal in a predetermined frequency band from an antenna, in a communication apparatus. In the low-noise amplifier, an input reception signal is very weak in many cases. Hence, the gain of the low-noise amplifier is set to a large value. When noise is included in an input signal of the low-noise amplifier, the noise is considerably amplified. Hence, noise included in the input signal needs to be suppressed as much as possible.

Japanese Unexamined Patent Application Publication No. H11-234063 (Patent Document 1) discloses a low-noise amplifier including an LC resonant circuit which is formed of an inductance element and a capacitor and which resonates at a frequency in use included in a predetermined frequency band. With such a configuration, a negative resistance generated at a high frequency is attenuated, and the stability of an amplifier becomes favorable.

Patent Document 1: Japanese Unexamined Patent Application Publication No. 11-234063

BRIEF SUMMARY

An LC resonant circuit has characteristics in which the Q-value is low and the half width is wide. Therefore, the pass band of the LC resonant circuit is wide. Hence, noise included in an input signal of a low-noise amplifier may not be effectively suppressed.

The present disclosure provides a low-noise amplifier that effectively suppresses noise included in an input signal of a low-noise amplifier.

A low-noise amplifier according to an embodiment of the present disclosure is a low-noise amplifier for amplifying a reception signal, in a predetermined frequency band, from an antenna. The low-noise amplifier includes: an input terminal; an output terminal; a field effect transistor; and a branch circuit. The branch circuit is branched from a circuit connecting the input terminal or the output terminal to the field effect transistor. The branch circuit is connected to an elastic wave resonator.

The term "connected" means both a case in which the branch circuit is directly connected and a case in which the branch circuit is indirectly connected by using another device.

The elastic wave resonator can be located outside of the duplexer. The low-noise amplifier can further include a first matching line and a second matching line. The field effect transistor includes a gate terminal and a source terminal. The first matching line is connected to the gate terminal and the branch circuit. One end portion of the second matching line is connected to the source terminal and another end portion of the second matching line is grounded. A sum of a length of the first matching line and a length of the second matching line is less than or equal to a length corresponding to a case where an absolute value of a phase of a transmission signal or a phase of a disturbance wave is 50 degrees, or is less than or equal to 50/360λ.

Examples of a "disturbance wave" include a harmonic of a transmission signal, a plurality of transmission signals of different frequencies generating intermodulation waves in a reception frequency band, and a signal causing, due to intermodulation with the transmission signal, intermodulation waves to be generated in the reception frequency band.

The low-noise amplifier can further include a first matching line and a second matching line. The field effect transistor includes a drain terminal and a source terminal. The first matching line is connected to the drain terminal and the branch circuit. One end portion of the second matching line is connected to the source terminal and another end portion of the second matching line is grounded. A sum of a length of the first matching line and a length of the second matching line is less than or equal to a length corresponding to a case where an absolute value of the phase of a transmission signal or the phase of a disturbance wave is 50 degrees, or is less than or equal to 50/360λ.

The low-noise amplifier can be formed on a silicon substrate, together with a CMOS circuit.

Examples of the "silicon substrate" include a bulk silicon substrate and a silicon-on-insulator (SOI) substrate including an insulator layer.

The branch circuit can further include a first variable-capacitance device connected in series with the elastic wave resonator.

Examples of the "variable-capacitance device" include digitally tunable capacitors (DTCs).

The branch circuit can further include a second variable-capacitance device connected in parallel with the first variable-capacitance device.

The elastic wave resonator can include: a support substrate, a high-acoustic-velocity film, a low-acoustic-velocity film, a piezoelectric film, and an interdigital transducer (IDT) electrode. The high-acoustic-velocity film is stacked on the support substrate. The low-acoustic-velocity film is stacked on the high-acoustic-velocity film. The piezoelectric film is stacked on the low-acoustic-velocity film. The IDT electrode is formed on the piezoelectric film. An acoustic velocity of a bulk wave propagating in the high-acoustic-velocity film is higher than an acoustic velocity of a surface acoustic wave propagating in the piezoelectric film. An acoustic velocity of a bulk wave propagating in the low-acoustic-velocity film is lower than an acoustic velocity of a bulk wave propagating in the piezoelectric film.

An electronic apparatus according to an embodiment of the present disclosure includes: a duplexer, an elastic wave resonator, and the low-noise amplifier described above. The elastic wave resonator filters a signal that has passed through the duplexer. The low-noise amplifier is connected to the elastic wave resonator.

According to the low-noise amplifier of the present disclosure, noise in an input signal can be effectively suppressed.

DETAILED DESCRIPTION

First Embodiment

Hereinafter, embodiments of the present disclosure will be described in detail with reference to the drawings. Note that identical portions or corresponding portions in the figures are denoted by identical symbols and the description thereof will not be repeated.

Figure 1:
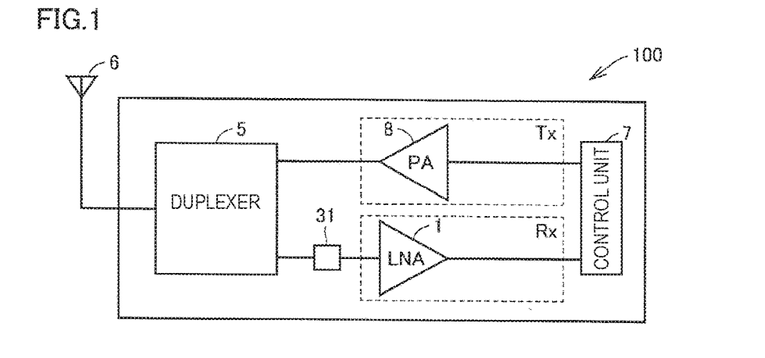
FIG. 1 is a functional block diagram for describing the functions of an electronic device including a low-noise amplifier according to a first embodiment.

FIG. 1 is a functional block diagram for describing the functions of an electronic device 100 including a low-noise amplifier 1 according to a first embodiment. The electronic device 100 is a device that performs wireless communication. The electronic device 100 may be, for example, a smart phone. Referring to FIG. 1, the electronic device 100 includes a low-noise amplifier (LNA) 1, an elastic wave resonator 31, a duplexer 5, an antenna 6, a control unit 7, and a power amplifier (PA) 8.

The control unit 7 performs integrated control of the electronic device 100. The control unit 7 outputs a transmission signal to the power amplifier 8 at the time of transmission and receives a reception signal from the low-noise amplifier 1 at the time of reception. Although not illustrated, the control unit 7 includes a CMOS circuit, a central processing unit (CPU), and a memory device. The memory device is, for example, a static random access memory (SRAM), or a dynamic random access memory (DRAM).

The antenna 6 is configured to perform transmission of a transmission signal and reception of a reception signal. The duplexer 5 connects the antenna 6 and the power amplifier 8 to each other at the time of transmission, and connects the antenna 6 and the low-noise amplifier 1 to each other at the time of reception. The duplexer 5 may be an antenna switch, a diplexer, or a circulator. Note that rather than making the antenna 6 have two functions of a transmission antenna and a reception antenna, the antenna 6 may be divided into two antennas: a transmission antenna and a reception antenna.

A transmission signal from the control unit 7 is amplified by the power amplifier 8 and output to the antenna 6. A reception signal received from the antenna 6 is amplified by the low-noise amplifier 1 and output to the control unit 7.

A reception signal input from the antenna 6 to the low-noise amplifier 1 is very weak in many cases. In general, the gain of a low-noise amplifier is set high. This allows the signal to noise (S/N) ratio to be enhanced. However, when noise is included in the input signal, the noise is greatly amplified and it becomes difficult to enhance the S/N ratio.

Examples of noise input to the low-noise amplifier 1 include a transmission signal leaked to a reception-side circuit from a transmission-side circuit, the harmonics of the transmission signal, a plurality of transmission signals having different frequencies that generate intermodulation waves in the reception frequency band, or a signal whose intermodulation waves caused by the transmission signal falls in the reception frequency band.

In the electronic device 100 according to the first embodiment, noise included in an input signal of the low-noise amplifier 1 is suppressed by using an elastic wave resonator. The elastic wave resonator has a resonant frequency band which is narrower than that in an LC resonant circuit. In other words, the pass band can be made narrower than in an LC resonant circuit. Hence, noise included in an input signal of the low-noise amplifier 1 can be effectively suppressed by the frequency band in which the elastic wave resonator resonates being included in the frequency band of a reception signal to be amplified.

Note that, as illustrated in FIG. 1, the elastic wave resonator 31 is outside of the duplexer 5. The reason for this is as follows. The reception filter existing within the duplexer 5 is usually designed so as to be a 50 ohm system and, hence, causes power to be attenuated. On the other hand, the low-noise amplifier 1 is subjected to distortion due to a voltage.

Hence, in the reception filter existing in the duplexer 5, even when the power of noise of a transmission signal and the like is attenuated, the voltage portion of the noise of the transmission signal and the like cannot be sufficiently attenuated in some cases. Hence, by placing the elastic wave resonator 31 outside of the duplexer 5, it becomes possible to attenuate the voltage portion of the noise of the transmission signal and the like input to the low-noise amplifier 1 and, hence, noise included in the input signal of the low-noise amplifier 1 can be even more effectively suppressed.

Figure 2:
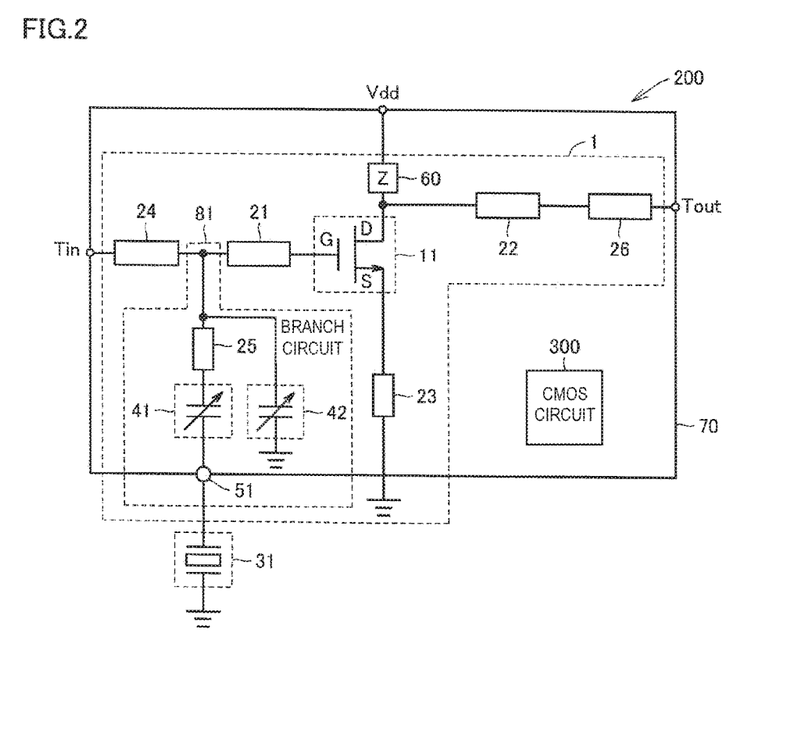
FIG. 2 is a circuit diagram for explaining the configuration of the low-noise amplifier of FIG. 1.

FIG. 2 is a circuit diagram for explaining the configuration of the low-noise amplifier 1 of FIG. 1. Referring to FIG. 2, the low-noise amplifier 1 includes a field effect transistor (FET) 11, matching lines 21, 22, 23, 24, and 26, an impedance element 60, and a branch circuit 81.

The field effect transistor 11, the matching lines 21, 22, 23, 24, and 26, the impedance element 60, and the branch circuit 81 are formed on a silicon substrate 70 together with a CMOS circuit 300. The silicon substrate 70 is an embodiment of a semiconductor substrate on which the low-noise amplifier 1 is formed. The CMOS circuit 300 forms a portion or the whole of the control unit 7 illustrated in FIG. 1, for example. The CMOS circuit 300 performs modulation and demodulation processing for a transmission signal and a reception signal, coding and decoding processing for the transmission signal and the reception signal, and control of the low-noise amplifier 1 and the power amplifier 8, and the like.

The low-noise amplifier 1, together with the CMOS circuit 300, forms a radio frequency integrated circuit (RFIC) 200. The low-noise amplifier 1, as a result of being formed on the silicon substrate 70, can be integrally formed together with the CMOS circuit 300. Hence, this allows the RFIC 200 to be reduced in size. Further, the manufacturing cost of the RFIC 200 can be reduced.

The field effect transistor 11 includes a gate terminal G, a source terminal S, and a drain terminal D. One end portion of the matching line 21 is connected to the gate terminal G. The other end portion of the matching line 21 is connected to the branch circuit 81 (one end portion of the matching line 24). The other end portion of the matching line 24 is connected to an input terminal Tin. The input terminal Tin is connected to the duplexer 5.

The branch circuit 81 includes a matching line 25, DTCs 41 and 42, and a shunt terminal 51. The branch circuit 81 is a circuit branched from a circuit connecting the field effect transistor 11 to the input terminal Tin to each other. The branch circuit 81 is a circuit connecting a point existing on a line connecting the matching line 21 and the matching line 24 to each other and the shunt terminal 51, and includes the shunt terminal 51.

One end portion of the matching line 25 is connected to a certain point of a line connecting the matching line 21 and the matching line 24 to each other.

The DTC 41 is arranged between the matching line 25 and the shunt terminal 51. One end portion of the DTC 42 is connected to a certain point of a line connected to the matching line 25. The DTC 42 is connected in parallel with the DTC 41. The other end portion of the DTC 42 is grounded.

One end portion of the elastic wave resonator 31 is connected to the shunt terminal 51 externally from the low-noise amplifier 1. The other end portion of the elastic wave resonator 31 is grounded. The elastic wave resonator 31 and the branch circuit 81 are connected in series with each other with the shunt terminal 51 therebetween.

The DTC 41 causes the resonant frequency of the elastic wave resonator 31 to be changed. This allows the frequency of a signal suppressed in the input signal of the low-noise amplifier 1 to be changed. The DTC 42 changes the anti-resonant frequency of the elastic wave resonator 31. This allows the frequency of a signal allowed to pass through the low-noise amplifier 1 to be changed. The DTCs 41 and 42 are formed inside the low-noise amplifier 1. Hence, a loss in the wiring can be reduced. Also in the modifications and embodiments described below, a loss in the wiring can be similarly reduced by forming a DTC within the RFIC.

One end portion of the impedance element 60 is connected to the drain terminal D of the field effect transistor 11. The other end portion of the impedance element 60 is connected to a drain-side power source Vdd. One end portion of the matching line 22 is connected to a certain point of a line connecting the drain terminal D and the impedance element 60 to each other. The other end portion of the matching line 22 is connected to one end portion of the matching line 26. The other end portion of the matching line 26 is connected to an output terminal Tout. The output terminal Tout is connected to the control unit 7.

One end portion of the matching line 23 is connected to the source terminal S of the field effect transistor 11. The other end portion of the matching line 23 is grounded.

Note that the above-described grounding portion where the other end portion of the matching line 23 is grounded may be inside the low-noise amplifier 1 or outside the low-noise amplifier 1. However, the grounding portion can be inside the low-noise amplifier 1 as in the first embodiment. The reason for this is as follows. In the case where the above-described grounding portion is located outside the low-noise amplifier 1, the length of the grounding line varies depending on the mounting substrate and, hence, the characteristics of the low-noise amplifier 1 may vary depending on each mounting substrate. In the case where the grounding portion is inside the low-noise amplifier 1, the characteristics of the low-noise amplifier 1 are stabilized, since the characteristics are unlikely to be influenced by the mounting substrate.

Figure 3:
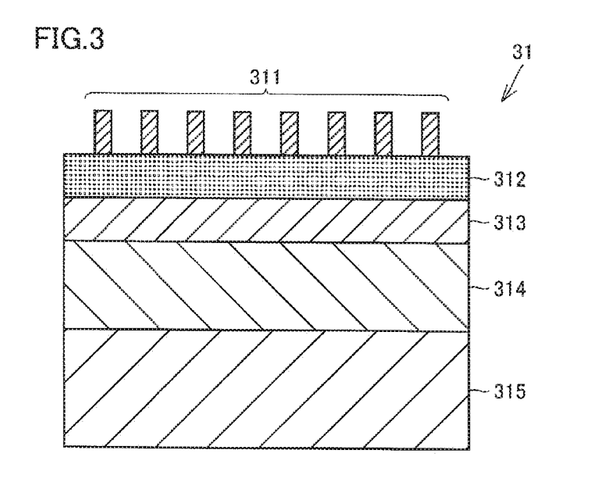
FIG. 3 is a sectional diagram schematically illustrating the configuration of the elastic wave resonator of FIG. 2.

FIG. 3 is a structure diagram schematically illustrating the structure of the elastic wave resonator 31 of FIG. 2. Referring to FIG. 3, the elastic wave resonator 31 includes a support substrate 315, a high-acoustic-velocity film 314 stacked on the support substrate 315, a low-acoustic-velocity film 313 stacked on the high-acoustic-velocity film 314, a piezoelectric film 312 stacked on the low-acoustic-velocity film 313, and an IDT electrode 311 formed on the piezoelectric film 312. The acoustic velocity of a bulk wave propagating through the high-acoustic-velocity film 314 is higher than the acoustic velocity of a surface acoustic wave propagating through the piezoelectric film 312. The acoustic velocity of a bulk wave propagating through the low-acoustic-velocity film 313 is lower than the acoustic wave of a bulk wave propagating through the piezoelectric film 312. The elastic wave resonator 31 is a surface acoustic wave (SAW) resonator having the structure described above. As a result of the structure like this, the Q factor of the elastic wave resonator 31 can be made to be high. As a result, the ranges of the resonant frequency and anti-resonant frequency that can be respectively changed by the DTC 41 and the DTC 42 can be made to be wide.

Figure 4A:
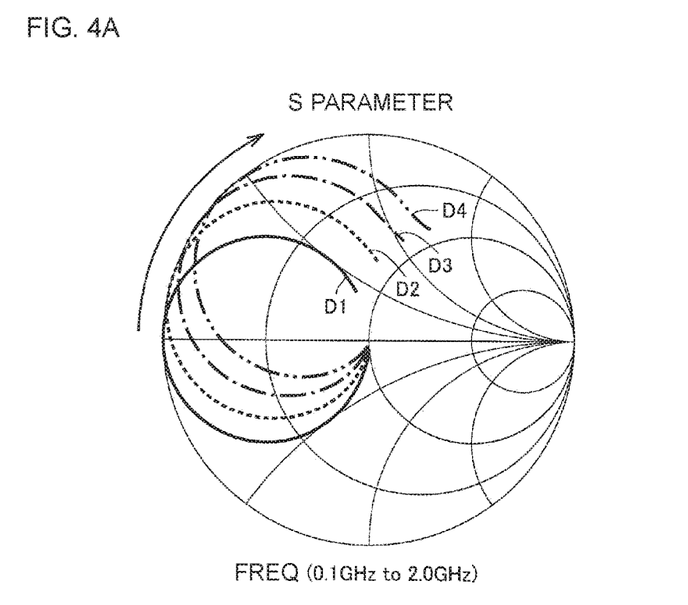
FIGS. 4A and 4B are diagrams illustrating the results of the simulation of changes in FIG. 4A, an S-parameter S11 of a low-noise amplifier and in FIG. 4B, a Y-parameter Y11 of the low-noise amplifier, when the frequency of the input signal is changed.
Figure 4B:
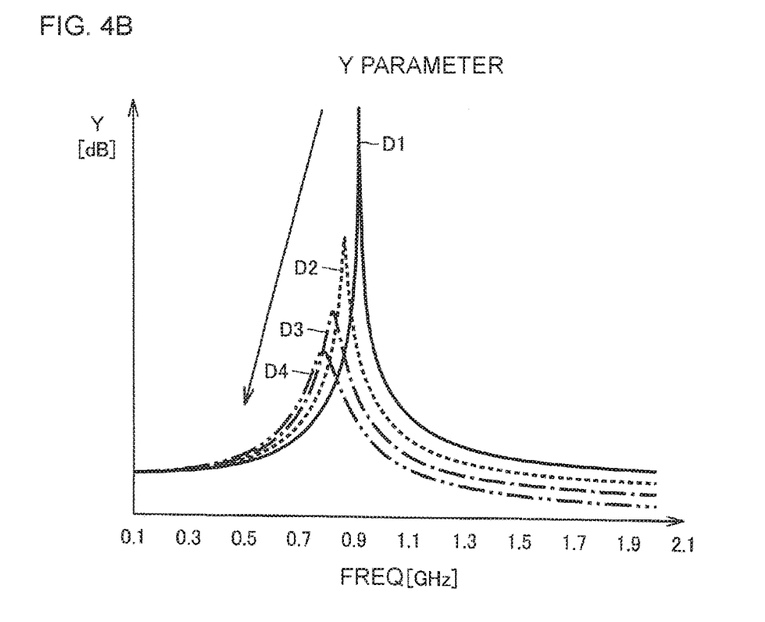

FIGS. 4A and 4B are diagrams illustrating the results of the simulation of changes in FIG. 4A, an S-parameter S11 of the low-noise amplifier 1 and in FIG. 4B, a Y-parameter Y11 of the low-noise amplifier 1, when the frequency of the input signal is changed. FIGS. 4A and 4B illustrate changes in the S-parameter S11 and the Y-parameter Y11, in the case where the sum of the lengths of the matching lines 21 and 23 changes as D1, D2, D3, and D4 (D1<D2<D3<D4).

Referring to FIG. 4A, as the sum of the lengths of the matching lines 21 and 23 changes from D1 to D4, a curve drawn by the S parameter S11 on the Smith chart rotates in a direction in which the resistance and reactance increase. This means that the impedance of the low-noise amplifier 1 increases.

Referring to FIG. 4B, the longer the sum of the lengths of the matching lines 21 and 23, the lower the peak value of the Y-parameter Y11. This fact also means that the impedance of the low-noise amplifier 1 increases similarly to FIG. 4A.

When the impedance of the low-noise amplifier 1 increases, the input voltage increases and, hence, the amplified output signal is more likely to be distorted.

In the first embodiment, the sum of the lengths of the matching lines 21 and 23 is less than a "predetermined length". More specifically, the "predetermined length" is a length corresponding to the case where the absolute value of the phase of a transmission signal or the phase of a disturbance wave is 50 degrees. This is also the case with modifications 1 to 3 of the first embodiment described below.

Figure 5:
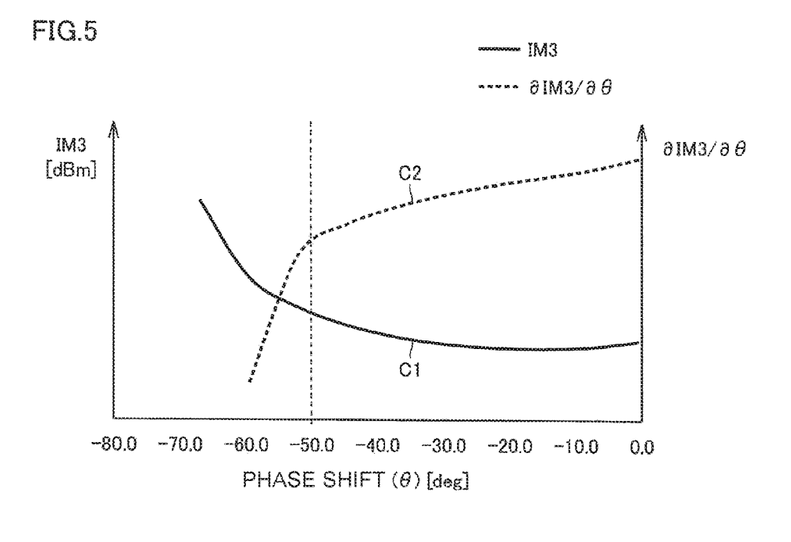
FIG. 5 is a diagram illustrating the simulation results of relationships between the third intermodulation distortion (IM3) of the low-noise amplifier of FIG. 2 as well as the inclination of the third intermodulation distortion and the phase shift of a transmission signal caused by passage through the matching lines of FIG. 2.

FIG. 5 is a diagram illustrating the simulation results of a relationship between the third intermodulation distortion (IM3) of the low-noise amplifier 1 of FIG. 2 and the phase shift of a transmission signal caused by passage through the matching lines 21 and 23, as well as a relationship between the inclination of the third intermodulation distortion and the phase shift of a transmission signal caused by passage through the matching lines 21 and 23. In FIG. 5, a curve C1 shows a change in the IM3 versus the phase shift, and a curve C2 shows a change in the inclination of the IM3 versus the phase shift. Referring to FIG. 5, it can be seen that when the absolute value of the phase shift of a transmission signal exceeds 50 degrees, the inclination of the curve C1 sharply increases. This means that when the absolute value of the phase shift of a transmission signal exceeds 50 degrees, the IM3 sharply increases. Hence, by making the sum of the lengths of the matching lines 21 and 23 be smaller than a length corresponding to the case where the absolute value of the phase of the transmission signal is 50 degrees, the low-noise amplifier 1 can suppress the IM3.

Figure 6:
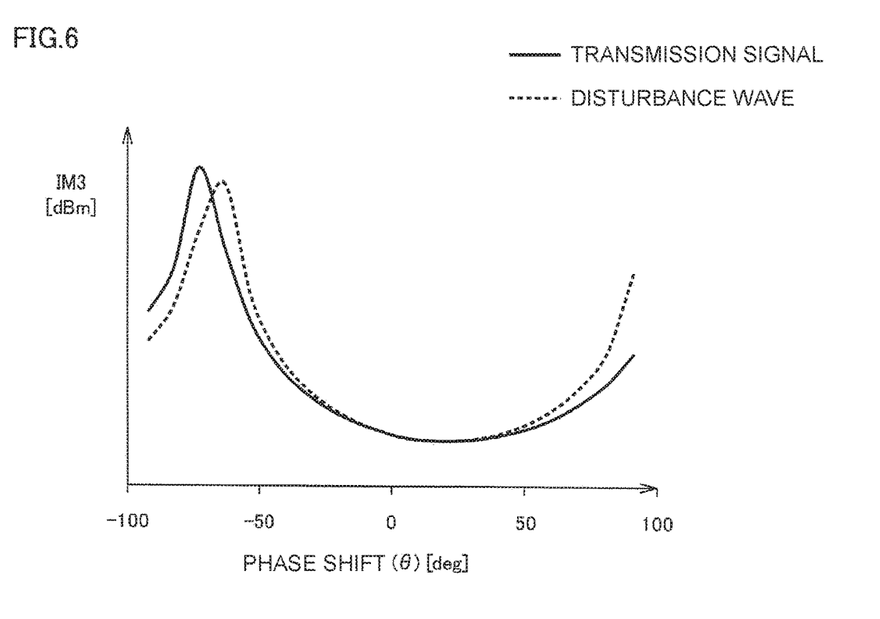
FIG. 6 is a diagram illustrating, regarding a transmission signal and a disturbance wave, the simulation results of a relationship between a phase shift caused by passage through the matching lines of FIG. 2 and the third intermodulation distortion (IM3) of the low-noise amplifier of FIG. 2.

FIG. 6 is a diagram illustrating, regarding a transmission signal and a disturbance wave, the simulation results of a relationship between a phase shift caused by passage through the matching lines 21 and 23 of FIG. 2 and the third intermodulation distortion (IM3) of the low-noise amplifier 1 of FIG. 2. Referring to FIG. 6, the relationship between the phase shift and the IM3 regarding the disturbance wave shows a tendency similar to that of the transmission signal. Hence, similarly to the transmission signal, the low-noise amplifier 1 can suppress the IM3 by making the sum of the lengths of the matching lines 21 and 23 be smaller than the length corresponding to the absolute value of 50 degrees of the phase of the transmission signal, also in the disturbance wave.

As described above, the low-noise amplifier 1 according to the first embodiment, as a result of including the elastic wave resonator 31, can effectively suppress noise included in an input signal.

The low-noise amplifier 1 according to the first embodiment includes the two DTCs 41 and 42. The low-noise amplifier 1 may have a configuration in which only one of the DTCs 41 and 42 is provided or a configuration in which none of the DTCs 41 and 42 is provided. A DTC is not an essential configuration component of a low-noise amplifier. This is also the case in the modifications and embodiments described below.

[First Modification of First Embodiment]

The low-noise amplifier 1 according to the first embodiment is connected to the single elastic wave resonator 31 arranged outside of the low-noise amplifier 1. The number of elastic wave resonators to which the low-noise amplifier 1 according to an embodiment of the present disclosure is connected may be two or more.

Figure 7:
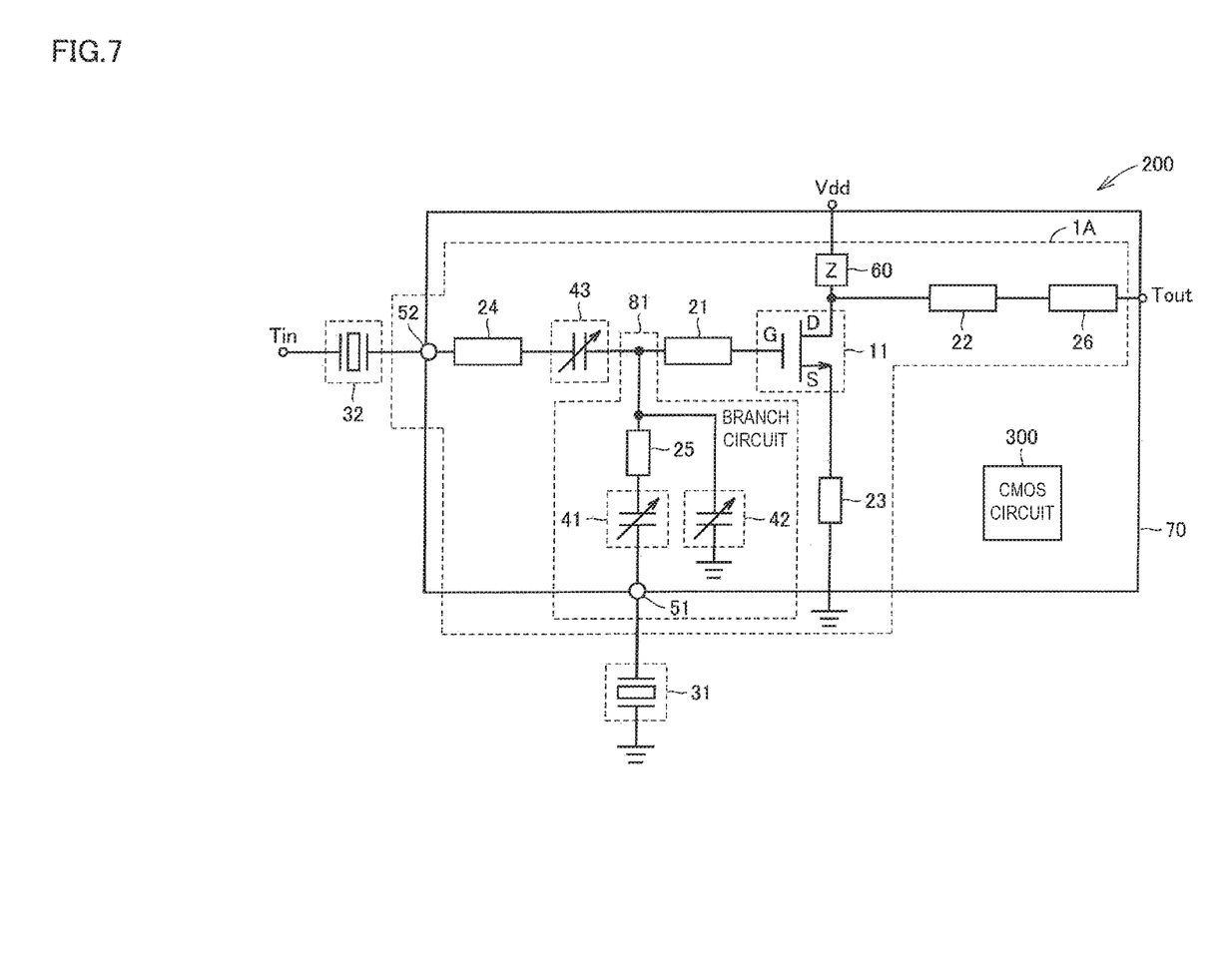
FIG. 7 is a circuit diagram for explaining the configuration of a low-noise amplifier according to a first modification of the first embodiment.

FIG. 7 is a circuit diagram for explaining the configuration of a low-noise amplifier 1A according to a first modification of the first embodiment. Referring to FIG. 7, the low-noise amplifier 1A further includes a shunt terminal 52 and a DTC 43 in addition to the configuration of the low-noise amplifier 1. Further, the low-noise amplifier 1A is connected to an elastic wave resonator 32 arranged outside of the low-noise amplifier 1A. The rest of the points are similar to those of the first embodiment and, hence, the description thereof will not be repeated.

One end portion of the elastic wave resonator 32 is connected to the input terminal Tin and the other end portion is connected to the shunt terminal 52. One end portion of the matching line 24 is connected to the shunt terminal 52. The DTC 43, which is arranged between the matching line 21 and the matching line 24, is connected in series with the elastic wave resonator 32. The DTC 43 changes the resonant frequency of the elastic wave resonator 32. This allows the frequency of a signal to be suppressed in the input signal of the low-noise amplifier 1A to be changed.

The low-noise amplifier 1A according to the first modification of the first embodiment, as a result of including the elastic wave resonators 31 and 32, can effectively suppress noise included in the input signal similarly to the first embodiment.

[Second Modification of First Embodiment]

In the first modification of the first embodiment, a second elastic wave resonator 32 is arranged between the input terminal Tin and the matching line 24. The arrangement of the second elastic wave resonator is not limited to the arrangement in the first modification of the first embodiment.

Figure 8:
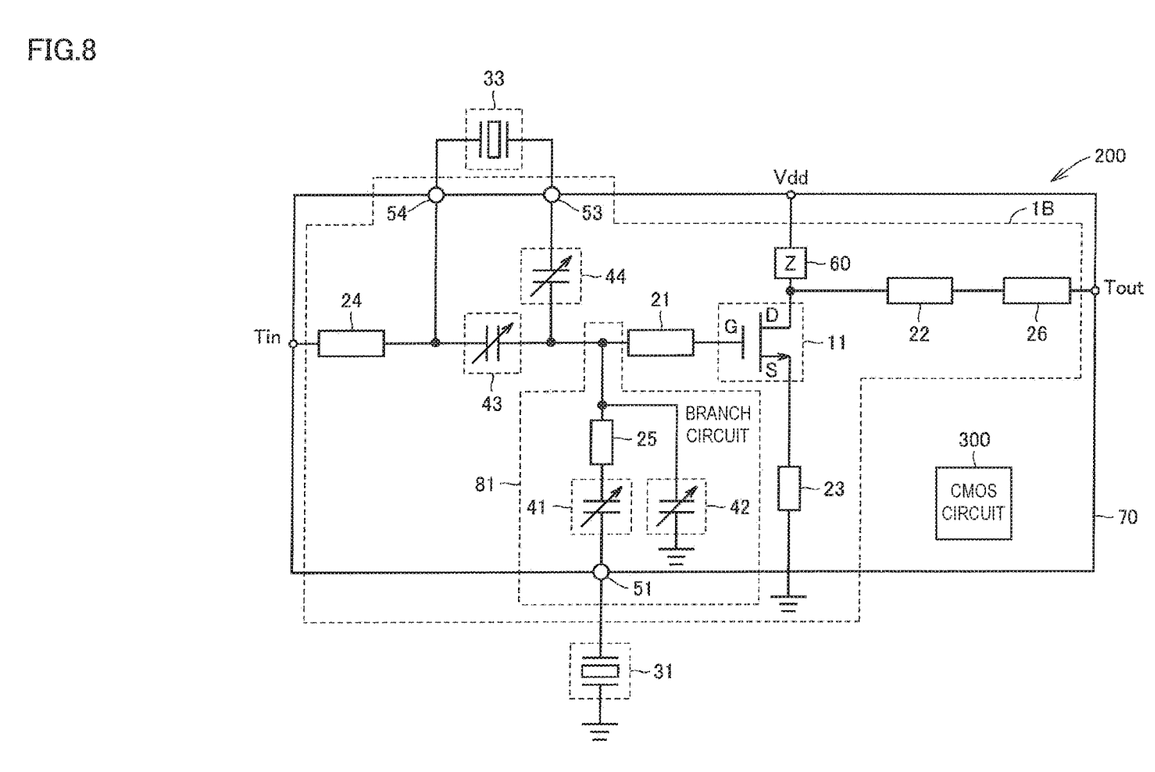
FIG. 8 is a circuit diagram for explaining the configuration of a low-noise amplifier according to a second modification of the first embodiment.

FIG. 8 is a circuit diagram for explaining the configuration of a low-noise amplifier 1B according to a second modification of the first embodiment. Referring to FIG. 8, the low-noise amplifier 1B, in addition to the configuration of the low-noise amplifier 1, further includes shunt terminals 53 and 54 and DTCs 43 and 44. The low-noise amplifier 1B is connected to an elastic wave resonator 33 arranged outside of the low-noise amplifier 1B. The rest of the points are similar to those of the first embodiment and, hence, the description thereof is not repeated.

One end portion of the elastic wave resonator 33 is connected to the shunt terminal 53 and the other end portion is connected to the shunt terminal 54. The shunt terminals 53 and 54 are connected at certain respective points along the line connecting the matching line 21 and the matching line 24 to each other. One end portion of the DTC 44 is connected to the shunt terminal 53 and the other end portion is connected to a certain point of a line connecting the matching line 21 and the matching line 24 to each other. The DTC 43 is arranged between the matching line 21 and the matching line 24.

The DTC 44 changes the resonant frequency of the elastic wave resonator 33. As a result, the frequency of a signal suppressed in the input signal of the low-noise amplifier 1B can be changed. The DTC 43 can change the frequency of a signal made to pass through the low-noise amplifier 1B, by changing the anti-resonant frequency of the elastic wave resonator 33.

The low-noise amplifier 1B according to the second modification of the first embodiment can effectively suppress noise included in an input signal similarly to the first embodiment as a result of including the elastic wave resonators 31 and 33.

[Third Modification of First Embodiment]

Hereinafter, description is made regarding the case in which the arrangement of the second elastic wave resonator is different from the arrangement in the first and second modifications of the first embodiment.

Figure 9:
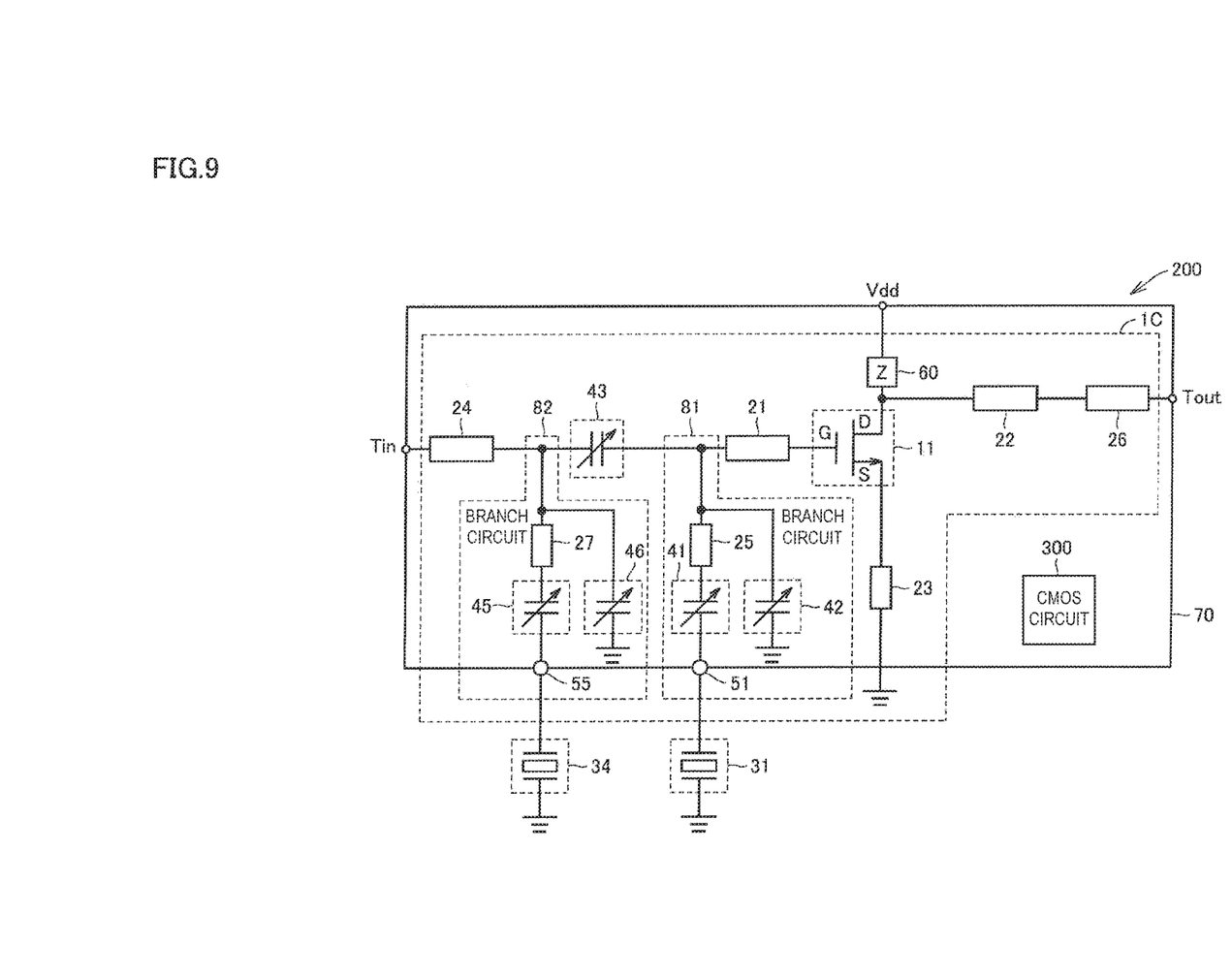
FIG. 9 is a circuit diagram for explaining the configuration of a low-noise amplifier according to a third modification of the first embodiment.

FIG. 9 is a circuit diagram for explaining the configuration of a low-noise amplifier 1C according to a third modification of the first embodiment. Referring to FIG. 9, the low-noise amplifier 1C further includes a branch circuit 82 in addition to the configuration of the low-noise amplifier 1.

The rest of the points are similar to those of the first embodiment and, hence, the description thereof is not repeated.

The branch circuit 82 includes a matching line 27, DTCs 45 and 46, and a shunt terminal 55. The branch circuit 82 is a circuit that is connected in parallel with a circuit connecting the field effect transistor 11 and the input terminal Tin to each other. The branch circuit 82 is a circuit connecting the shunt terminal 55 to a point on a line connecting the matching line 21 to the matching line 24 to each other.

One end portion of the matching line 27 is connected to a certain point of a line connecting the matching line 21 and the matching line 24 to each other. The DTC 45 is arranged between the matching line 27 and the shunt terminal 55. One end portion of the DTC 46 is connected to a certain point of a line connected to the matching line 27. The DTC 46 is connected in parallel with the DTC 45. One end portion of the DTC 46 is grounded.

One end portion of an elastic wave resonator 34 is connected to the shunt terminal 55 from the outside of the low-noise amplifier 1C. The other end portion of the elastic wave resonator 34 is grounded. The elastic wave resonator 34 and the branch circuit 82 are connected in series with each other with the shunt terminal 55 therebetween.

The DTC 45 changes the resonant frequency of the elastic wave resonator 34. This allows the frequency of a signal suppressed in the input signal of the low-noise amplifier 1C to be changed. The DTC 46 changes the anti-resonant frequency of the elastic wave resonator 34. This allows the frequency of a signal made to pass through the low-noise amplifier 1 to be changed.

The low-noise amplifier 1C according to the third modification of the first embodiment, can effectively suppress noise included in an input signal similarly to the first embodiment by the elastic wave resonators 31 and 34.

Second Embodiment

In the first embodiment, an elastic wave resonator is provided on the gate side of the field effect transistor. The location at which the elastic wave resonator is provided is not limited to the gate side of the field effect transistor 11. Hereinafter, the case in which the elastic wave resonator is provided on the drain side of the field effect transistor 11 is described.

Figure 10:
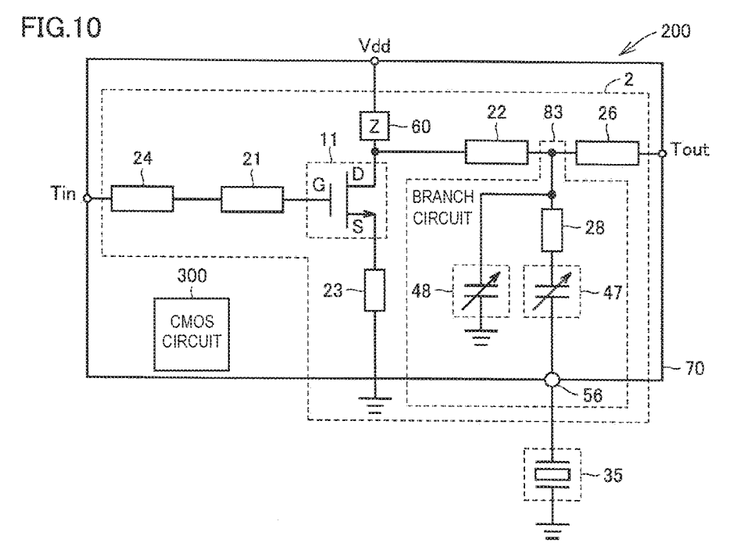
FIG. 10 is a circuit diagram for explaining the configuration of a low-noise amplifier according to a second embodiment.

FIG. 10 is a circuit diagram for explaining the configuration of a low-noise amplifier 2 according to a second embodiment. Referring to FIG. 10, the low-noise amplifier 2 has a branch circuit 83 arranged on the drain side of the field effect transistor 11 instead of the branch circuit 81 arranged on the gate side of the field effect transistor 11 in the low-noise amplifier 1. The rest of the configuration is the same as that of the first embodiment and, hence, the description thereof is not repeated.

The branch circuit 83 includes a matching line 28, DTCs 47 and 48, and a shunt terminal 56. The branch circuit 83 is a circuit connected in parallel with a circuit connecting the field effect transistor 11 and the output terminal Tout to each other. The branch circuit 83 is a circuit that connects a point on a line connecting the matching line 22 and the matching line 26 to each other and the shunt terminal 56 to each other.

One end portion of the matching line 28 is connected to a certain point of a line connecting the matching line 22 and the matching line 26 to each other. The DTC 47 is arranged between the matching line 28 and the shunt terminal 56. One end portion of the DTC 48 is connected to a certain point of a line connected to the matching line 28. The DTC 48 is connected in parallel with the DTC 47. The other end portion of the DTC 48 is grounded.

One end portion of an elastic wave resonator 35 is connected to the shunt terminal 56 externally from the low-noise amplifier 2. The other end portion of the elastic wave resonator 35 is grounded. In other words, the shunt terminal 56 is used for connection to the elastic wave resonator 35.

The elastic wave resonator 35 and the branch circuit 83 are connected in series with each other with the shunt terminal 56 therebetween.

The DTC 47 can change the frequency of a signal suppressed in an input signal of the low-noise amplifier 2, by changing the resonant frequency of the elastic wave resonator 35. The DTC 48 can change the frequency of a signal made to pass through the low-noise amplifier 2 by changing the anti-resonant frequency of the elastic wave resonator 35.

Figure 11:
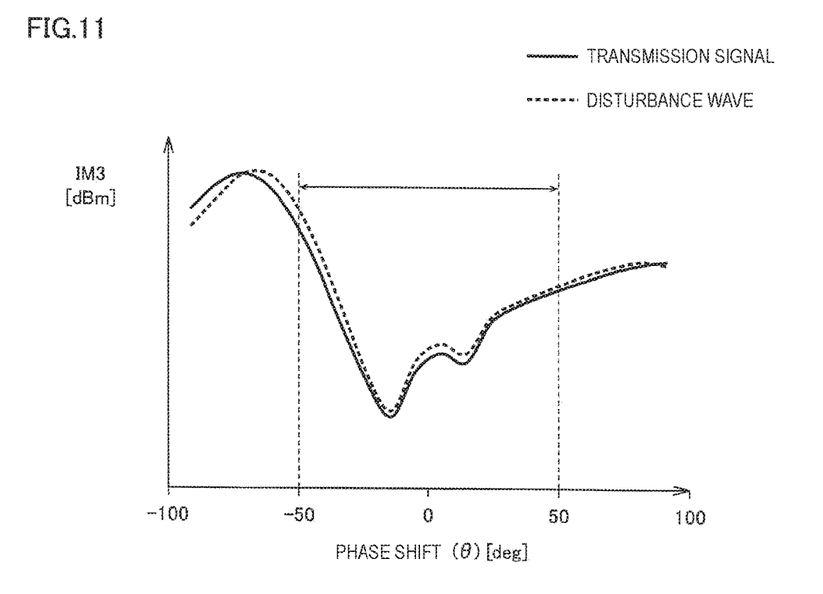
FIG. 11 is a diagram illustrating the simulation results of a relationship between a phase shift due to passage through the matching lines of FIG. 10 and the third intermodulation distortion (IM3) of the low-noise amplifier of FIG. 10, respectively for a transmission signal and a disturbance wave.

FIG. 11 is a diagram illustrating the simulation results of a relationship between a phase shift due to passage through the matching lines 22 and 23 of FIG. 10 and the third intermodulation distortion (IM3) of the low-noise amplifier 2 of FIG. 10, respectively for a transmission signal and a disturbance wave. Referring to FIG. 11, the transmission signal and the disturbance wave show similar trends regarding the relationship between the phase shift and the IM3. The IM3 in a range of the absolute value of the phase shift of 50 degrees or below becomes smaller than the IM3 in a range in which the absolute value of the phase shift is larger than 50 degrees.

In the low-noise amplifier 2 according to the second embodiment, the total length of the matching lines 22 and 23 is smaller than the length corresponding to the case where the absolute value of the phase of a transmission signal or the phase of a disturbance wave is 50 degrees. Hence, the low-noise amplifier 2 can suppress the IM3.

The low-noise amplifier 2 includes the elastic wave resonator 35 arranged on the drain side of the field effect transistor 11. According to the second embodiment, noise included in an input signal can be effectively suppressed although not so much as in the first embodiment.

Further, as a result of the elastic wave resonator 35 being arranged on the drain side of the field effect transistor 11, the low-noise amplifier 2 can suppress a noise index more than in the first embodiment.

Third Embodiment

In the first and second embodiments, an elastic wave resonator is arranged on the gate side or drain side of a field effect transistor. Hereinafter, a case in which an elastic wave resonator is arranged on each of the gate side and the drain side of a field effect transistor will be explained.

Figure 12:
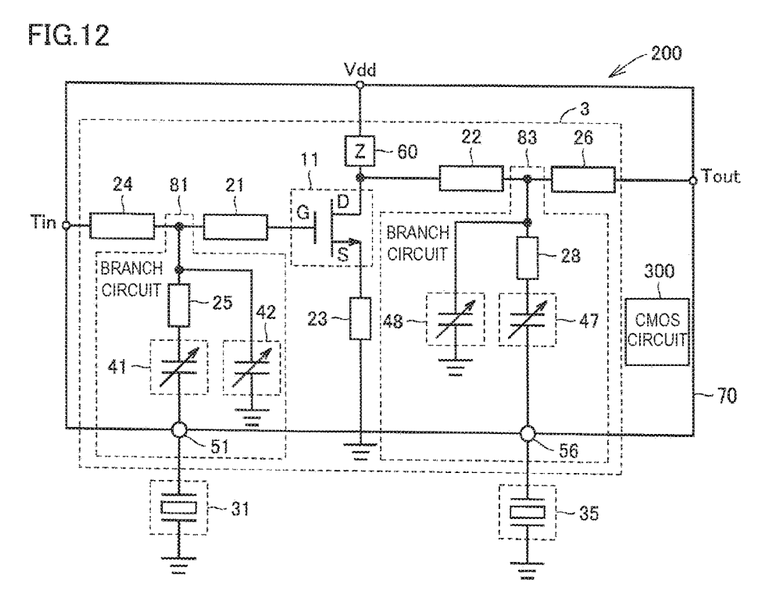
FIG. 12 is a circuit diagram for explaining the configuration of a low-noise amplifier according to a third embodiment.

FIG. 12 is a circuit diagram for explaining the configuration of a low-noise amplifier 3 according to a third embodiment. The low-noise amplifier 3 has a configuration obtained by adding the branch circuit 83 of the second embodiment to the drain side of the configuration of the first embodiment. Each configuration component has already been explained and, hence, the explanation thereof will not be repeated.

In the low-noise amplifier 3 according to the third embodiment, the sum of the lengths of the matching lines 21 and 23 is smaller than a length corresponding to the case where the phase of a transmission signal or the phase of a disturbance wave has an absolute value of 50 degrees. In addition, the sum of the lengths of the matching lines 22 and 23 is smaller than a length corresponding to the case where the phase of the transmission signal or the phase of the disturbance wave has an absolute value of 50 degrees. As a result of this, the low-noise amplifier 2 can suppress the IM3.

The low-noise amplifier 3 according to the third embodiment can realize suppression of noise included in an input signal and suppression of the noise index with a good balance between them.

Fourth Embodiment

A low-noise amplifier according to the first embodiment, the second embodiment, or the third embodiment includes a single field effect transistor. The number of field effect transistors included in a low-noise amplifier according to an embodiment may be two or more. Hereinafter, a case where two field effect transistors are provided will be described.

Figure 13:
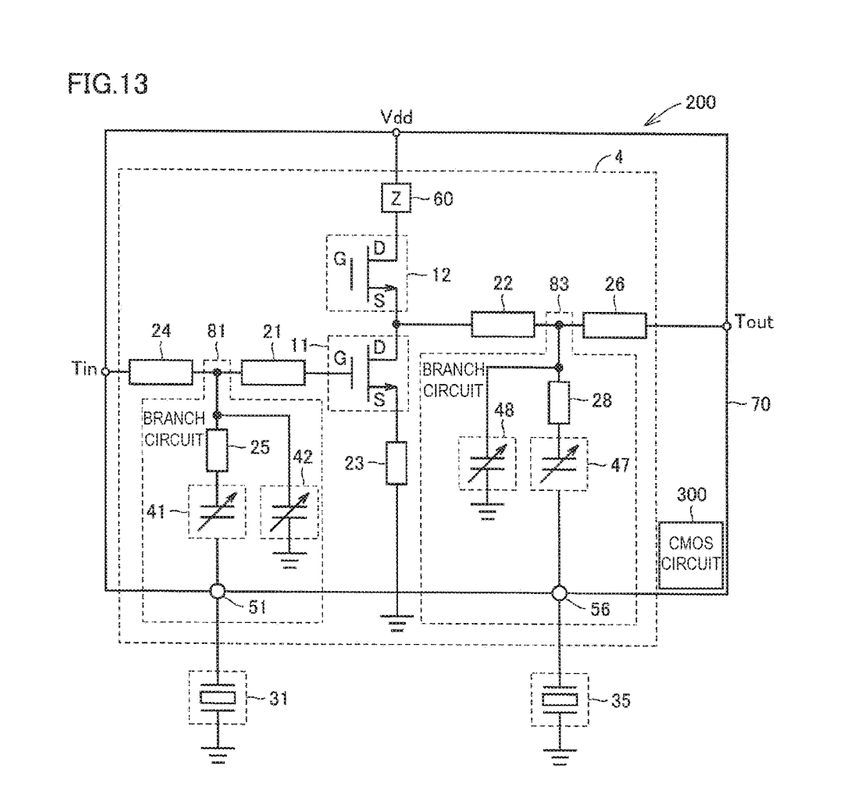
FIG. 13 is a circuit diagram for explaining the configuration of a low-noise amplifier according to a fourth embodiment.

A fourth embodiment is different from the third embodiment in that the fourth embodiment includes a second field effect transistor 12. The rest of the points are similar to those of the third embodiment and, hence, the description thereof will not be repeated.

FIG. 13 is a circuit diagram for explaining the configuration of a low-noise amplifier 4 according to the fourth embodiment. Referring to FIG. 13, the field effect transistor 12 includes a gate terminal G, a source terminal S, and a drain terminal D. The drain terminal D of the field effect transistor 12 is connected to an impedance element 60. The source terminal S of the field effect transistor 12 is connected to the drain terminal D of a field effect transistor 11. The field effect transistor 11 and the field effect transistor 12 form a cascode stage (interstage).

The low-noise amplifier 4 according to the fourth embodiment, even in the case where two field effect transistors form a cascode stage, provides an effect similar to that of the first to third embodiments, due to the elastic wave resonators 31 and 35. This is also the case even when three of more field effect transistors form a cascode stage.

Even in the case where a plurality of field effect transistors form a cascode stage, the elastic wave resonator need not be arranged on both the gate side and drain side of the field effect transistor 11, and it suffices that the elastic wave resonator is provided on one of the gate side and the drain side of the field effect transistor 11.

In the low-noise amplifiers according to any of the first to fourth embodiments, a length corresponding to the absolute value of 50 degrees of the phase of a transmission signal or the phase of a disturbance wave is used as a "predetermined length". The absolute value of a phase is not limited to 50 degrees and, for example, the value on the basis of simulation results or experimental results can be appropriately determined based on an actual apparatus.

Note that, when λ is defined to be the wavelength of a transmission signal or a signal of a disturbance wave, a length corresponding to the absolute value of 50 degrees of the phase of a transmission signal or the phase of a disturbance wave is 50/360 (0.139) of the wavelength (λ) of the transmission signal or disturbance wave. However, the proportion to the wavelength is not limited to 0.139, and is desirably determined appropriately on the basis of, for example, simulation results or experimental results based on an actual apparatus.

The low-noise amplifier according to any of the first to fourth embodiments includes the silicon substrate 70 and is formed in such a manner as to be unified with an RFIC. A low-noise amplifier according to an embodiment need not include a silicon substrate and may include a substrate including gallium arsenide (GaAs). The low-noise amplifier can suppress power consumption as a result of including a substrate including gallium arsenide. In this case, the low-noise amplifier cannot be formed on a silicon substrate and, hence, forms a circuit different from the CMOS circuit included in the RFIC. In other words, the low-noise amplifier is not included in the RFIC.

In the low-noise amplifier according to any of the first to fourth embodiments, a SAW resonator is used as an elastic wave resonator. The elastic wave resonator may be a device other than a SAW resonator and may be, for example, a bulk acoustic wave (BAW) resonator.

The embodiments disclosed here are also planned to be implemented in an appropriately combined manner. It is to be thought that the embodiments disclosed here are illustrative in all points and are not restrictive. It is intended that the scope of the present invention is to be shown by the claims and not by the explanation described above and that all the modifications having the equivalent meaning and within the scope of the claims are included.

REFERENCE SIGNS LIST 1, 1A, 1B, 1C, 2, 3, 4 low-noise amplifiers
5 duplexer
6 antenna
7 control unit
8 power amplifier
11, 12 field effect transistors
21, 22, 23, 24, 25, 26, 27, 28 matching lines
31, 32, 33, 34, 35 elastic wave resonators
51, 52, 53, 54, 55, 56 shunt terminals
60 impedance element
70 silicon substrate
81, 82, 83 branch circuits
100 electronic device
200 RFIC
300 CMOS circuit
311 electrode
312 piezoelectric film
313 low-acoustic-velocity film
314 high-acoustic-velocity film
315 support substrate
D drain terminal
G gate terminal
S source terminal
Tin input terminal
Tout output terminal
Vdd drain-side power source

The invention claimed is:

1. A low-noise amplifier for amplifying a reception signal in a predetermined frequency band from an antenna, comprising:
   an input terminal;
   an output terminal;
   a field effect transistor; and
   a first branch circuit branched from a circuit connecting the input terminal to the field effect transistor or branched from a circuit connecting the output terminal to the field effect transistor,
   wherein the first branch circuit is connected to an elastic wave resonator,
   wherein one end portion of the elastic wave resonator is indirectly connected to a gate terminal or a drain terminal of the field effect transistor by the first branch circuit and the other end portion of the elastic wave resonator is grounded.

2. The low-noise amplifier according to claim 1,
wherein the low-noise amplifier further comprises a first matching line and a second matching line,
wherein the field effect transistor includes a gate terminal and a source terminal,
wherein the first matching line is connected to the gate terminal and the first branch circuit, and
wherein a first end of the second matching line is connected to the source terminal and a second end of the second matching line is grounded.

3. The low-noise amplifier according to claim 2,
wherein a sum of a length of the first matching line and a length of the second matching line is less than or equal to a length corresponding to a case where an absolute value of a phase of a transmission signal or a phase of a disturbance wave is 50 degrees, or is less than or equal to $50/360\lambda$.

4. The low-noise amplifier according to claim 1,
wherein the low-noise amplifier further comprises a first matching line and a second matching line,
wherein the field effect transistor includes a drain terminal and a source terminal,
wherein the first matching line is connected to the drain terminal and the first branch circuit,
wherein a first end of the second matching line is connected to the source terminal and a second end of the second matching line is grounded.

5. The low-noise amplifier according to claim 4,
wherein a sum of a length of the first matching line and a length of the second matching line is less than or equal to a length corresponding to a case where an absolute value of a phase of a transmission signal or a phase of a disturbance wave is 50 degrees, or is less than or equal to $50/360\lambda$.

6. The low-noise amplifier according to claim 2, wherein the low-noise amplifier is formed on a silicon substrate together with a CMOS circuit.

7. The low-noise amplifier according to claim 4, wherein the low-noise amplifier is formed on a silicon substrate together with a CMOS circuit.

8. The low-noise amplifier according to claim 2, wherein the first branch circuit includes a first variable-capacitance device connected in series with the elastic wave resonator.

9. The low-noise amplifier according to claim 4, wherein the first branch circuit includes a first variable-capacitance device connected in series with the elastic wave resonator.

10. The low-noise amplifier according to claim 8, wherein the first branch circuit further includes a second variable-capacitance device connected in parallel with the first variable-capacitance device.

11. The low-noise amplifier according to claim 9, wherein the first branch circuit further includes a second variable-capacitance device connected in parallel with the first variable-capacitance device.

12. The low-noise amplifier according to claim 1,
wherein the elastic wave resonator includes:
a support substrate,
a high-acoustic-velocity film stacked on the support substrate,
a low-acoustic-velocity film stacked on the high-acoustic-velocity film,
a piezoelectric film stacked on the low-acoustic-velocity film, and
an interdigital transducer (IDT) electrode formed on the piezoelectric film,
wherein an acoustic velocity of a bulk wave propagating in the high-acoustic-velocity film is higher than an acoustic velocity of a surface acoustic wave propagating in the piezoelectric film, and
wherein an acoustic velocity of a bulk wave propagating in the low-acoustic-velocity film is lower than an acoustic velocity of a bulk wave propagating in the piezoelectric film.

13. The low-noise amplifier according to claim 1, further comprising a second branch circuit,
wherein the first branch circuit is branched from the circuit connecting the input terminal to the field effect transistor and the second branch circuit is branched from the circuit connecting the output terminal to the field effect transistor.

14. The low-noise amplifier according to claim 1, further comprising a second branch circuit,
wherein the first and second branch circuits are branched from the circuit connecting the input terminal to the field effect transistor, and
wherein the circuit connecting the input terminal to the field effect transistor includes a variable-capacitance device between the first and second branch circuits.

15. An electronic apparatus comprising:
a duplexer,
the low-noise amplifier according to claim 1, and
the elastic wave resonator, the elastic wave resonator being configured to filter a signal that has passed through the duplexer.

16. The low-noise amplifier according to claim 15, wherein the elastic wave resonator is located outside of the duplexer.

* * * * *